(12) United States Patent
Ohshita et al.

(10) Patent No.: US 9,745,493 B2
(45) Date of Patent: Aug. 29, 2017

(54) SURFACE TREATMENT COMPOSITION AND ARTICLE OBTAINED USING SAME

(71) Applicant: DAIKIN INDUSTRIES, LTD., Osaka-shi, Osaka (JP)

(72) Inventors: Shinsuke Ohshita, Edinbubrgh (GB); Tomohiro Yoshida, Settsu (JP); Kaori Ozawa, Settsu (JP); Akinari Sugiyama, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 156 days.

(21) Appl. No.: 14/388,588

(22) PCT Filed: Mar. 4, 2013

(86) PCT No.: PCT/JP2013/055872
§ 371 (c)(1),
(2) Date: Sep. 26, 2014

(87) PCT Pub. No.: WO2013/146110
PCT Pub. Date: Oct. 3, 2013

(65) Prior Publication Data
US 2015/0118504 A1  Apr. 30, 2015

(30) Foreign Application Priority Data

Mar. 29, 2012 (JP) .................... 2012-077580
Sep. 7, 2012 (JP) .................... 2012-197082

(51) Int. Cl.

| | |
|---|---|
| *C09D 171/00* | (2006.01) |
| *C09D 5/16* | (2006.01) |
| *C23C 14/12* | (2006.01) |
| *C03C 17/42* | (2006.01) |
| *C08G 65/00* | (2006.01) |
| *C08G 65/336* | (2006.01) |

(52) U.S. Cl.
CPC ............ *C09D 171/00* (2013.01); *C03C 17/42* (2013.01); *C08G 65/007* (2013.01); *C08G 65/336* (2013.01); *C09D 5/1668* (2013.01); *C09D 5/1675* (2013.01); *C09D 5/1681* (2013.01); *C23C 14/12* (2013.01); *Y10T 428/31663* (2015.04)

(58) Field of Classification Search
CPC .. C09D 171/00; C09D 5/1668; C09D 5/1675; C09D 5/1681; C09D 183/08; C09D 7/12; C03C 17/42; C23C 14/12; Y10T 428/31663
See application file for complete search history.

(56) References Cited

U.S. PATENT DOCUMENTS

| | | |
|---|---|---|
| 6,183,872 B1 | 2/2001 | Tanaka et al. |
| 2002/0024737 A1 | 2/2002 | Hanaoka et al. |
| 2003/0181044 A1 | 9/2003 | Takahashi et al. |
| 2004/0021966 A1 | 2/2004 | Takahashi et al. |
| 2011/0098402 A1 | 4/2011 | Yamane et al. |
| 2013/0136928 A1 | 5/2013 | Yamane et al. |

FOREIGN PATENT DOCUMENTS

| | | |
|---|---|---|
| EP | 0433070 A2 | 6/1991 |
| EP | 2316869 A1 | 5/2011 |
| JP | 07-053919 A | 2/1995 |
| JP | 10-237383 A | 9/1998 |
| JP | 11-310869 A | 11/1999 |
| JP | 2001-290002 A | 10/2001 |
| JP | 2004-126532 A | 4/2004 |
| JP | 2004-225009 A | 8/2004 |
| JP | 2004-226942 A | 8/2004 |
| JP | 2006-197546 A | 7/2006 |
| JP | 2008-534696 A | 8/2008 |
| JP | 2011-116947 A | 6/2011 |
| WO | 97/07155 A1 | 2/1997 |
| WO | 2006/107083 A2 | 10/2006 |
| WO | 2012/064989 A1 | 5/2012 |

OTHER PUBLICATIONS

Communication dated Feb. 2, 2016 from the European Patent Office issued in corresponding Application No. 13768164.9.
International Preliminary Report on Patentability issued on Oct. 1, 2014 from The International Bureau of WIPO in counterpart International Patent Application No. PCT/JP2013/055872.
International Search Report for PCT/JP2013/055872 dated Jun. 4, 2013 [PCT/ISA/210].

*Primary Examiner* — Robert Jones, Jr.
(74) *Attorney, Agent, or Firm* — Sughrue Mion, PLLC

(57) ABSTRACT

A surface-treating composition including a fluorine-containing polymer which is able to form a layer having both high surface slip property and high friction durability. The surface-treating composition includes a first compound (a reactive fluorine-containing polymer which is a fluorine-containing silane polymer) and a second compound (a non-reactive fluorine-containing polymer which is a fluorine-containing oil), and the proportion of the first compound is 15 to 70% by mass with respect to the total mass of the first compound and the second compound.

15 Claims, No Drawings

SURFACE TREATMENT COMPOSITION AND ARTICLE OBTAINED USING SAME

CROSS REFERENCE TO RELATED APPLICATIONS

This application is a National Stage of International Application No. PCT/JP2013/055872 filed Mar. 4, 2013, claiming priority based on Japanese Patent Application Nos. 2012-077580 filed Mar. 29, 2012 and 2012-197082 filed Sep. 7, 2012, respectively, the contents of all of which are incorporated herein by reference in their entirety.

TECHNICAL FIELD

The present invention relates to a surface-treating composition comprising a fluorine-containing polymer and an article produced by using (or applying) the surface-treating composition.

BACKGROUND ART

A certain fluorine-containing polymer is known to be able to provide excellent water-repellency, oil-repellency, anti-fouling property, surface slip property, or the like when it is used on a surface treatment of a base material. A layer (hereinafter, referred to as a "surface-treating layer") formed from the surface-treating composition comprising a fluorine-containing polymer is applied to various base materials such as a glass, a plastic, a fiber and a building material as a so-called a functional thin film.

As such fluorine-containing polymer, a fluorine-containing polymer (hereinafter, referred to as a "fluorine-containing silane polymer) which has a hydrolyzable group bonding to a Si atom in its molecular terminal is known (see Patent Literatures 1 and 2). This fluorine-containing silane polymer is a reactive fluorine-containing polymer wherein the hydrolyzable group bonding to a Si atom reacts and bonds in between the base material and the polymers.

PRIOR ART LITERATURE

Patent Literature

Patent Literature 1: WO 97/07155
Patent Literature 2: JP 2008-534696 A
Patent Literature 3: JP 2004-126532 A

SUMMARY OF THE INVENTION

Problem to be Solved by the Invention

Since the layer formed from the surface-treating composition comprising a fluorine-containing silane polymer can exert the above functions even in form of a thin film, it is suitably used in an optical member such as glasses and a touch panel which are required to have optical permeability or transparency. In particular, in these uses, the surface slip property is required to facilitate wiping of a fouling such as fingerprints when the fouling is adhered. Furthermore, the friction durability is required to maintain the functions even when the layer is repeatedly subjected to frictions.

Additionally, recently, a smartphone and a tablet terminal rapidly become popular, and in use of a touch panel, the layer is desired to provide excellent tactile feeling when a user operates by touching a display panel with his finger. Therefore, it is required to achieve further higher surface slip property than the prior art.

However, a layer formed from the conventional surface-treating composition comprising a fluorine-containing silane polymer cannot easily achieve further higher surface slip property than the prior art, maintaining high friction durability.

For example, with respect to a water-repellent film, it is proposed to apply a double layered structure to the water-repellent film; form a lower layer in contact with a base material from a composition which comprises an organosilane compound containing a fluorine-substituted alkyl group and a non-silane-containing perfluoropolyether as major components; and form a upper layer exposing on a surface of the water-repellent film from a composition which comprises non-silane-containing perfluoropolyether as a major component in order to be able to smoothly wipe the water-repellent film when the fouling on the water-repellent film is wiped off (see Patent Literature 3).

When the double layered structure is applied, the surface slip property is predicted to increase due to the upper layer formed from the composition comprising the non-silane-containing perfluoropolyether as a major component. However, since the non-silane-containing perfluoropolyether is a non-reactive fluorine-containing polymer, it has less friction durability. Therefore, the upper layer is worn down by undergoing the repeated frictions, as a result, the surface slip property is decreased.

An object of the present invention is to provide a surface-treating composition comprising a fluorine-containing polymer which can form a layer having both a high surface slip property and high friction durability. Furthermore, an object of the present invention is to provide an article produced by using the surface-treating composition.

Means to Solve the Problem

According to one aspect of the present invention, there is provided a surface-treating composition comprising a fluorine-containing polymer wherein the surface-treating composition comprises:

at least one first compound represented by any of the following general formulae (I) and (II):

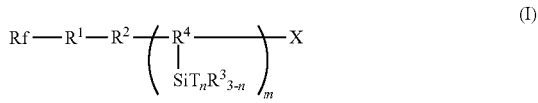

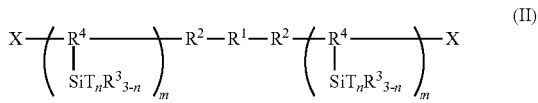

wherein:
Rf is an alkyl group having 1 to 16 carbon atoms which may be substituted by one or more fluorine atoms;
$R^1$ is a group represented by the following formula:

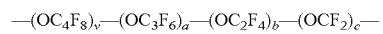

wherein:
a, b, c and v are each independently an integer of 0 or more and 200 or less, wherein the sum of a, b, c and v is at least one, and the occurrence order of the respective repeating units in parentheses is not limited in the formula;

$R^2$ is a group represented by the following formula:

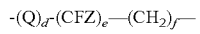

wherein:

Q is an oxygen atom or a divalent polar group;

Z is a fluorine atom or a lower fluoroalkyl group; and d, e and f are each independently an integer of 0 or more and 50 or less, wherein the sum of d, e and f is at least one, and the occurrence order of the respective repeating units in parentheses is not limited in the formula;

T is a hydroxyl group or a hydrolyzable group;

$R^3$ is a hydrogen atom or an alkyl group having 1 to 22 carbon atoms;

n is an integer from 1 to 3;

$R^4$ is a group represented by the following formula:

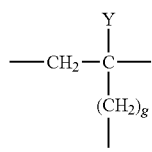

wherein:

Y is a hydrogen atom or a lower alkyl group, and g is an integer of 0 or more and 50 or less;

X is a hydrogen atom, an alkyl group having 1 to 4 carbon atoms or a halogen atom; and m is an integer of 1 or more and 10 or less; and at least one second compound represented by the following general formula (III):

$$Rf—R^1—Rf' \quad (III)$$

wherein:

Rf is an alkyl group having 1 to 16 carbon atoms which may be substituted by one or more fluorine atoms;

Rf' is an alkyl group having 1 to 16 carbon atoms which may be substituted by one or more fluorine atoms, a fluorine atom or a hydrogen atom;

$R^1$ is a group represented by the following formula:

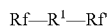

wherein:

r, s, t and w are each independently an integer of 0 or more and 300 or less, wherein the sum of r, s, t and w is at least one, and the occurrence order of the respective repeating units in parentheses is not limited in the formula; and the proportion of the first compound is 15 to 70% by mass with respect to the total mass of the first compound and the second compound.

It is noted that when there are some same symbols in a general formula, the symbols can be each independently selected.

The above described surface-treating composition of the present invention comprises the above described first compound and the above described second compound which are a fluorine-containing polymer. Among these, the first compound is a reactive fluorine-containing polymer which is understood as a fluorine-containing silane polymer and the first compound can provide the layer formed from the surface-treating composition with high friction durability. On the other hand, the second compound is a non-reactive fluorine-containing polymer which is understood as a fluorine-containing oil and the second compound can provide the layer formed from the surface-treating composition with higher surface slip property than that provided by the first compound. The above surface-treating composition of the present invention contains the first compound of 15 to 70% by mass with respect to the total mass of the first compound and the second compound, and the second compound of 85 to 30% by mass, and thereby being able to form a layer having both high friction durability and high surface slip property.

In one embodiment of the present invention, the first compound may be one or more compounds represented by any of the following general formulae (Ia) and (IIa):

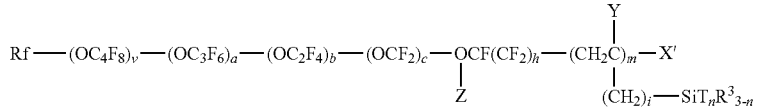

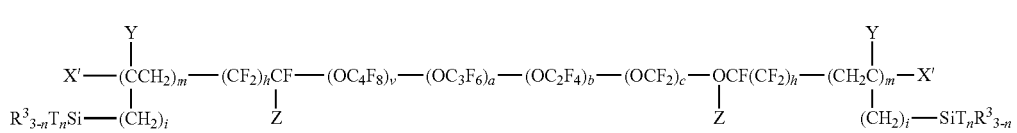

wherein:

Rf, a, b, c, v, T, $R^3$, n, m, Y and Z are as defined above;

h is 0 or 1;

i is an integer of 0 or more and 2 or less; and

X' is a hydrogen atom or a halogen atom;

wherein the occurrence order of the respective repeating units in parentheses with the subscript a, b, c or v is not limited in the formulae.

In other embodiment of the present invention, the first compound may be one or more compounds represented by any of the following general formulae (Ib) and (IIb):

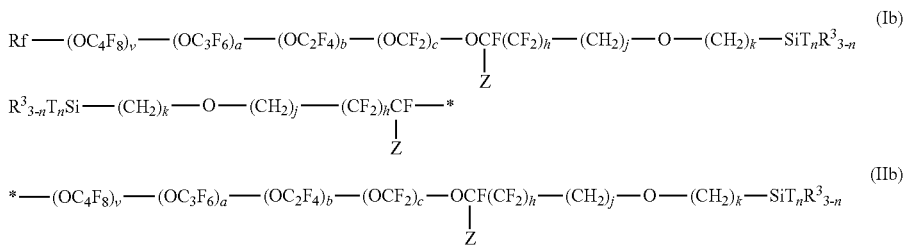

wherein:
Rf, a, b, c, v, T, $R^3$, n and Z are as defined above;
h is 0 or 1;
j is 1 or 2;
k is an integer of 2 or more and 20 or less;
wherein the occurrence order of the respective repeating units in parentheses with the subscript a, b, c or v is not limited in the formulae.

In the present invention, $R^1$ is a group of the formula: $—(OCF_2CF_2CF_2)_{a'}—$; and a' may be an integer of 1 or more and 100 or less in the general formulae (I) and (II) for the first compound.

In one embodiment of the present invention, the second compound may be one or more compounds represented by any of the general formulae (IIIa) and (IIIb):

wherein:
Rf and Rf' are as defined above;
in formula (IIIa), r' is an integer of 1 or more and 100 or less; and
in formula (IIIb), w' and r' are each independently an integer of 1 or more and 30 or less; and s' and t' are each independently an integer of 1 or more and 300 or less;
wherein the occurrence order of the respective repeating units in parentheses with the subscript w', r', s' or t' is not limited in the formulae.

In this embodiment, the above second compound may contain the compound represented by the general formula (IIIa) and the compound represented by the general formula (IIIb) in ratio of 1:1-1:30.

In the present invention, the second compound may have an average molecular weight of 1,000-30,000. In particular, the compound represented by the general formula (IIIa) may have an average molecular weight of 2,000-6,000. The compound represented by the general formula (IIIb) may have an average molecular weight of 8,000-30,000.

It is noted that the "average molecular weight" as used in the present invention means a number average molecular weight and is a value which is measured by a $^{19}$F-NMR. It is noted that the "average molecular weight" can be measured by a GPC (Gel Permeation Chromatography) analysis, but regarding the compound represented by the general formula (IIIb), there may be a difference between a value measured by the $^{19}$F-NMR and a value measured by the GPC analysis while regarding the compounds of the general formulae (I), (II) and (IIIa), there is no significant difference between a value measured by the $^{19}$F-NMR and a value measured by the GPC analysis.

According to other aspect of the present invention, there is provided an article comprising a base material and a layer (surface-treating layer) which is formed from the surface-treating composition of the present invention. The layer in the article has both surface slip property and high friction durability.

According to other aspect of the present invention, there is provided a method of vapor deposition comprising a step of forming a deposited film on a surface of a base material by using the surface-treating composition of the present invention as a depositing material wherein a profile of film thickness deposited per second during the formation of the deposited film has at least two peaks.

The above at least two peaks are predicted to be derived from the at least one first compound and the at least one second compound. It is preferable that, among the at least two peaks, the firstly appearing peak during the formation of the deposited film is derived from the at least one first compound and the lastly appearing peak during the formation of the deposited film is derived from the at least one second compound. It is noted that a peak being derived from a compound means that most of the peak is attributed to the compound.

According to further aspect of the present invention, there is provided an article comprising a base material and a layer consisting of the deposited film formed on a surface of the base material by the above method of vapor deposition. The layer in the article has both surface slip property and high friction durability.

It is preferable that the layer consisting of the deposited film comprises a lower layer contacting to the base material and an upper layer located at a surface of the layer consisting of the deposited film, and a content ratio of the second compound in the upper layer is higher than a content ratio of the second compound in the lower layer. The layer in the article has further higher surface slip property.

Effect of the Invention

According to the present invention, there is provided a surface-treating composition which comprises the first compound (a reactive fluorine-containing polymer which is understood as a fluorine-containing silane polymer) and the second compound (a non-reactive fluorine-containing polymer which is understood as a fluorine-containing oil) in a prescribed ratio, and thereby being able to form a layer having both high surface slip property and high friction durability. Additionally, according to the present invention, there is provided an article produced by using the surface-treating composition.

EMBODIMENTS TO CARRY OUT THE INVENTION

Hereinafter, the surface-treating composition of the present invention and the article produced by using this surface-treating composition will be described in detail, although the present invention is not limited thereto.

Firstly, in order to prepare the surface-treating composition, the first compound and the second compound are provided.

The first compound is a compound having a hydrolyzable group or a hydroxyl group (reactive part) which bond to a Si atom in one terminal or both terminals wherein a compound having it in one terminal is represented by the general formula (I) and a compound having it in both terminal is represented by the general formula (II).

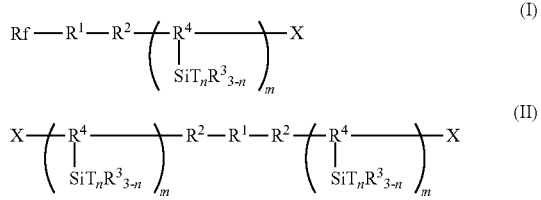

In these formulae, Rf is an alkyl group (for example, straight chain or branched chain) having 1 to 16 carbon atoms which may be substituted by one or more fluorine atoms, preferably a straight or branched alkyl group having 1 to 3 carbon atoms which may be substituted by one or more fluorine atoms (for example, $CF_2H$—, $HCF_2CF_2$—, $HCF_2C_2F_4$—). The alkyl group having 1 to 16 carbon atoms which may be substituted by one or more fluorine atoms are preferably a perfluoroalkyl group having 1 to 16 carbon atoms, more preferably a straight or branched perfluoroalkyl group having 1 to 3 carbon atoms (for example, $CF_3$—, $C_2F_5$—, $C_3F_7$—).

$R^1$ is a group represented by the following formula.

$$—(OC_4F_8)_v—(OC_3F_6)_a—(OC_2F_4)_b—(OCF_2)_c—$$

In this formula, a, b, c and v represent the repeating number of each of three repeating units of perfluoropolyether which constitute a main backbone of the polymer, and are each independently an integer of 0 or more and 200 or less, preferably an integer of 0-100 wherein the sum of a, b, c and v is at least one, preferably 1-100. The occurrence order of the respective repeating units in parentheses with the subscript a, b, c or v is not limited though they are described in a specific order in the formulae. Among these repeating units, the —$(OC_4F_8)$— group may be any of —$(OCF_2CF_2CF_2CF_2)$—, —$(OCF(CF_3)CF_2CF_2)$—, —$(OCF_2CF(CF_3)CF_2)$—, —$(OCF_2CF_2CF(CF_3))$—, —$(OC(CF_3)_2CF_2)$—, —$(OCF_2C(CF_3)_2)$—, —$(OCF(CF_3)CF(CF_3))$—, —$(OCF(C_2F_5)CF_2)$— and —$(OCF_2CF(C_2F_5))$—, preferably —$(OCF_2CF_2CF_2CF_2)$. The —$(OC_3F_6)$— group may be any of —$(OCF_2CF_2CF_2)$—, —$(OCF(CF_3)CF_2)$— and —$(OCF_2CF(CF_3))$—, preferably —$(OCF_2CF_2CF_2)$—. The —$(OC_2F_4)$— group may be any of —$(OCF_2CF_2)$— and —$(OCF(CF_3))$—, preferably —$(OCF_2CF_2)$—.

$R^2$ is a group represented by the following formula.

$$-(Q)_d-(CFZ)_e-(CH_2)_f—$$

In this formula, Q is an oxygen atom (—O—) or other divalent polar group. Examples of the divalent polar group include —O—, —COO—, —OCO—, —CONH—, —OCH_2CH(OH)CH_2—, —CH_2CH(OH)CH_2O—, —COS—, —SCO— and the like, preferably —O—, —COO—, —CONH—, —CH_2CH(OH)CH_2O—. Z is a fluorine atom or a lower fluoroalkyl group, for example a fluoroalkyl group having 1-3 carbon atoms. The lower fluoroalkyl group is, for example, a fluoroalkyl group having 1-3 carbon atoms, preferably a perfluoroalkyl group having 1-3 carbon atoms, more preferably a trifluoromethyl group, a pentafluoroethyl group, more preferably a trifluoromethyl group. In this formula, d, e and f are each independently an integer of 0 or more and 50 or less, preferably an integer of 0-20 wherein the sum of d, e and f is at least one, preferably 1-10. It is more preferable that d, e and f are an integer of 0-2. It is further more preferable that d is zero or 1, e is 2 and f is zero or 1. The occurrence order of the respective repeating units in parentheses with the subscript d, e and f is not limited and it is optional though they are described in a specific order in the formulae.

T and $R^3$ are a group bonding to Si. A subscript n is an integer of 1-3.

T is a hydroxyl group or a hydrolyzable group. Examples of the hydrolyzable group include —OA, —OCOA, —O—N=C(A)_2, —N(A)_2, —NHA, halogen (wherein A is a substituted or non-substituted alkyl group having 1-3 carbon atoms). The hydroxyl group is not particular limited, but may be that produced by the hydrolysis of the hydrolyzable group.

$R^3$ is a hydrogen atom or an alkyl group (for example, straight chain or branched chain) having 1 to 22 carbon atoms, preferably an alkyl group having 1 to 22 carbon atoms, more preferably a straight or branched alkyl group having 1 to 3 carbon atoms ($CH_3$—, $C_2H_5$—, $C_3H_7$—).

$R^4$ is a group represented by the following formula.

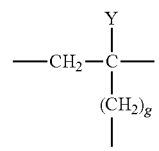

In this formula, Y is a hydrogen atom or a lower alkyl group. The lower alkyl group is preferably an alkyl group having 1 to 20 carbon atoms. The subscript g is an integer of 0 or more and 50 or less, preferably an integer of 1 or more and 20 or less. The bonding of the repeating unit in parentheses with the subscript g bonds to Si.

X is a hydrogen atom, an alkyl group having 1 to 4 carbon atoms or a halogen atom, preferably a hydrogen atom or an alkyl group having 1 to 4 carbon atoms. The halogen atom may be, for example, a bromine atom or an iodine atom, but not particularly limited thereto.

The subscript m is an integer of 1 or more and 10 or less, preferably an integer of 1 or more and 6 or less.

The first compound may be prepared by any method. For example, the first compound can be prepared by the following method, but not limited thereto.

Firstly, one or more compounds represented by any of the general formulae (i) and (ii):

$$Rf—R^1—R^2—COF \quad (i)$$

$$FOC—R^2—R^1—R^2—COF \quad (ii)$$

is subjected to iodination reaction to obtain one or more compounds represented by any of the following general formulae (i-a) and (ii-a):

$$Rf—R^1—R^2—I \quad (i-a)$$

$$I—R^2—R^1—R^2—I \quad (ii-a).$$

Next, the one or more compounds represented by any of the following general formulae (i-a) and (ii-a) thus obtained is reacted with the following compound(s):

$CH_2=CR^5-(CH_2)_u-SiX''_nR^3_{3-n}$ and T-H or $CH_2=CR^5-(CH_2)_t-SiT_nR^3_{3-n}$ wherein, u is an integer of 0 or more and 2 or less, X" is a halogen atom, and T and $R^3$ are as defined above, preferably T is the above described —OA, $R^3$ is an alkyl group having 1-3 carbon atoms, and $R^5$ is a hydrogen atom or an alkyl group having 1-4 carbon atoms, to obtain the one or more compounds represented by any of the general formulae (I) and (II). It is noted that in the present specification, the symbols in the formulae are as defined above, unless otherwise specified.

Example of the above first compound includes the compound (may be one compound or a mixture of two or more compounds) represented by any of the following general formulae (Ia) and (IIa).

A molecular weight of the first compound is not particular limited to, for example, the first compound may have an average molecular weight of 1,000-12,000. Among this range, it is preferable to have the average molecular weight of 2,000-10,000 in view of friction durability.

On the other hand, the second compound is a compound having no a Si atom and is represented by the following general formula (III).

$$Rf-R^1-Rf' \quad (III)$$

In the formula, Rf and $R^1$ are as defined above for the general formulae (I) and (II), and Rf' is an alkyl group having 1 to 16 carbon atoms which may be substituted by one or more fluorine atoms, a fluorine atom or a hydrogen atom. It is noted that Rf and $R^1$ may be each independently selected in the general formulae (I) and (II) and the general formula (III).

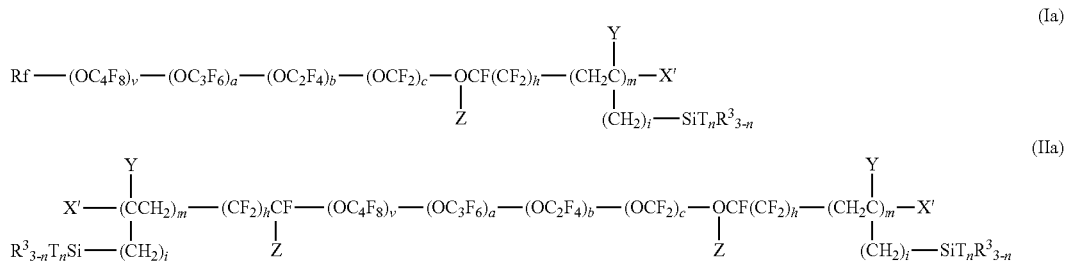

In these formulae, Rf, a, b, c, v, T, $R^3$, n, m, Y and Z are as defined above. The occurrence order of the respective repeating units in parentheses with the subscript a, b, c or v is not limited in the formulae. The subscript h is 0 or 1. The subscript i is an integer of 0 or more and 2 or less. X' is a hydrogen atom or a halogen atom. The halogen atom is preferably an iodine atom, a chlorine atom or a fluorine atom.

Other example of the above first compound includes the compound (may be one compound or a mixture of two or more compounds) of the following general formulae (Ib) and (IIb).

The second compound can be prepared by a reaction for forming perfluoropolyether which is well-known by those skilled in the art.

Example of the above second compound includes the compound (may be one compound or a mixture of two or more compounds) represented by any of the following general formulae (IIIa) and (IIIb)

$$Rf-(OCF_2CF_2CF_2)_{r'}-Rf' \quad (IIIa)$$

$$Rf-(OCF_2CF_2CF_2F_2)_{w'}-(OCF_2CF_2CF_2)_{r'}-$$
$$(OCF_2CF_2)_{s'}-(OCF_2)_{t'}-Rf' \quad (IIIb)$$

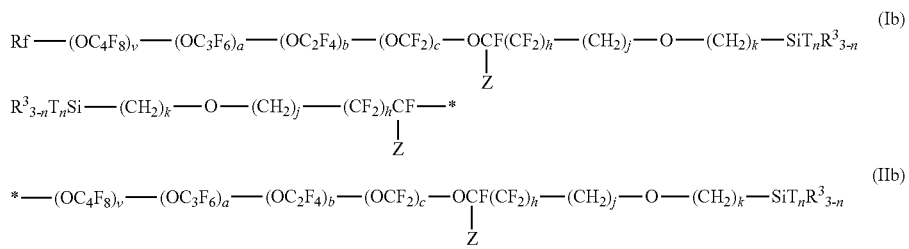

In these formulae, Rf, a, b, c, v, T, $R^3$, n and Z are as defined above. The subscript h is 0 or 1. The occurrence order of the respective repeating units in parentheses with the subscript a, b, c or v is not limited in the formulae. The subscript j is 1 or 2. The subscript k is an integer of 2 or more and 20 or less.

$R^1$ in the general formulae (I) and (II) for the first compound is a group represented by $-(OCF_2CF_2CF_2)_{a'}-$ wherein a' is preferably an integer of 1 or more and 100 or less. In this case, suitable friction durability can be provided.

In these formulae, Rf and Rf' are as defined above. In formula (IIIa), r' is an integer of 1 or more and 100 or less. In formula (IIIb), w' and r' are each independently an integer of 1 or more and 30 or less, and s' and t' are each independently an integer of 1 or more and 300 or less. The occurrence order of the respective repeating units in parentheses with the subscript w', r', s' or t' is not limited in the formulae.

The compound represented by the general formula (IIIa) and the compound represented by the general formula (IIIb)

may be used alone or in combination. The compound represented by the general formula (IIIb) is preferably used because it can provide higher surface slip property than when the compound represented by the general formula (IIIa) is used. When they are used in combination, it is preferable that the compound represented by the general formula (IIIa) and the compound represented by the general formula (IIIb) is used in the ratio of 1:1 to 1:30 by mass. By applying such ratio, a surface-treating composition which has a good balance of surface slip property and friction durability can be obtained.

The second compound has preferably an average molecular weight of 1,000-30,000. By having this average molecular weight, high surface slip property can be obtained. More specifically, the average molecular weight can be selected depending on the structure of the second compound used so as to provide a desired surface slip property. In general, the compounds are selected such that the compound represented by the general formula (IIIb) has larger average molecular weight than the compound represented by the general formula (IIIa) in order to obtain higher surface slip property. Representatively, for the compound represented by the general formula (IIIa), the average molecular weight is preferably 2,000-6,000. For the compound represented by the general formula (IIIb), the average molecular weight is preferably 8,000-30,000. Within this range of the average molecular weight, high friction durability and high surface slip property can be obtained.

The first compound and the second compound which are provided above are mixed in a prescribed ratio to prepare the surface-treating composition.

In the surface-treating composition obtained, the proportion of the first compound is 15 to 70% by mass with respect to the total mass of the first compound and the second compound (hereinafter the same shall apply). By making the proportion of the first compound 15% by mass or more, high friction durability is obtained, and by making it 70% by mass or less, high surface slip property is obtained. The proportion of the first compound is preferably 18-65% by mass, more preferably 20-60% by mass.

It is noted that a method for mixing the first compound and the second compound is not particular limited as long as these proportion finally obtained in the surface-treating composition is within the above range. For example, the first compound and the second compound may be each separately provided and mixed. Alternatively, for example, a pre-mixture containing the first compound and the second compound and the rest of the first compound and/or the second compound may be mixed. Representatively, the rest of the second compound may be added to the pre-mixture containing the first compound and the second compound.

The surface-treating composition is obtained as described above. According to the surface-treating composition, a layer having both high surface slip property and high friction durability can be formed. Although the present invention is not bound to any theory, the reason can be considered as follows. The first compound is a reactive fluorine-containing polymer which is understood as a fluorine-containing silane polymer, and by the reaction of a hydrolyzable group or hydroxyl group bonding to a Si atom in the first compound between the polymer and the base material as well as the polymers, the first compound can bind them. On the other hand, the second compound is a non-reactive fluorine-containing polymer which is understood as a fluorine-containing oil and has lubricating property by itself. The first compound and the second compound have a divalent perfluoropolyether group in the polymer main chain, thereby having an affinity for each other. In a surface-treating layer formed by applying the surface-treating composition comprising the first compound and the second compound to the surface of the base material, the binding between the first compounds as well as the binding between the first compound and the base material are formed by the reaction of the first compound. As the result, the surface-treating layer having high film strength can be formed with high adherence strength on the surface of the base material, and this contributes to the friction durability of the surface-treating layer. Furthermore, in the surface-treating layer, the second compound does not react, and it is relatively-loosely held or acquired in the surface-treating layer by an affinity to the first compound. As the result, the second compound can stay in the surface-treating layer against friction, providing the surface-treating layer with high surface slip property. Therefore, both high surface slip property and high friction durability can be simultaneously achieved.

Next, an article which is produced by using the surface-treating composition will be described. The article of the present invention comprises a base material and a layer (surface-treating layer) which is formed from the surface-treating composition described above on the surface of the base material. This article can be produced, for example, as follows.

Firstly, the base material is provided. The base material usable in the present invention may be composed of any suitable material such as a glass, a resin (may be a natural or synthetic resin such as a common plastic material, and may be in form of a plate, a film, or others), a metal (may be a simple substance of a metal such as aluminum, copper, or iron, or a complex such as alloy or the like), a ceramic, a semiconductor (silicon, germanium, or the like), a fiber (a fabric, a non-woven fabric, or the like), a fur, a leather, a wood, a pottery, a stone, or the like.

For example, when an article to be produced is an optical member, any layer (or film) such as a hard coating layer or an antireflection layer may be formed on the surface (outermost layer) of the base material. As the antireflection layer, either a single antireflection layer or a multi antireflection layer may be used. Examples of an inorganic material usable in the antireflection layer include $SiO_2$, $SiO$, $ZrO_2$, $TiO_2$, $TiO$, $Ti_2O_3$, $Ti_2O_5$, $Al_2O_3$, $Ta_2O_5$, $CeO_2$, $MgO$, $Y_2O_3$, $SnO_2$, $MgF_2$, $WO_3$, and the like. These inorganic materials may be used alone or in combination with two or more (for example, as a mixture). When multi antireflection layer is formed, preferably, $SiO_2$ and/or $SiO$ are used in the outermost layer. When an article to be produced is an optical glass part for a touch panel, it may have a transparent electrode, for example, a thin layer comprising indium tin oxide (ITO), indium zinc oxide, or the like on a part of the surface of the base material (glass). Furthermore, the base material may have an insulating layer, an adhesive layer, a protecting layer, a decorated frame layer (I-CON), an atomizing layer, a hard coating layer, a polarizing film, a phase difference film, a liquid crystal display module, and the like, depending on its specific specification.

The shape of the base material is not specifically limited. The region of the surface of the base material on which the surface-treating layer should be formed may be at least a part of the surface of the base material, and may be appropriately determined depending on use, the specific specification, and the like of the article to be produced.

The base material may be that of which at least the surface consists of a material originally having a hydroxyl group. Examples of such material include a glass, in addition, a metal on which a natural oxidized film or a thermal oxidized film is formed (in particular, a base metal), a ceramic, a semiconductor, and the like. Alternatively, as in a resin, when the hydroxyl groups are present but not sufficient, or when the hydroxyl group is originally absent, the hydroxyl group can be introduced on the surface of the base material, or the number of the hydroxyl group can be increased by subjecting the base material to any pretreatment. Examples of the pretreatment include a plasma treatment (for example, corona discharge) or an ion beam irradiation. The plasma treatment may be suitably used to introduce the hydroxyl group into or increase it on the surface of the base material, further, to clarify the surface of the base material (remove foreign materials, and the like). Alternatively, other examples of the pretreatment include a method wherein a monolayer of a surface adsorbent having a carbon-carbon unsaturated bond group is formed on the surface of the base material by using a LB method (Langmuir-Blodgett method) or a chemical adsorption method beforehand, and then, cleaving the unsaturated bond under an atmosphere of oxygen and nitrogen.

Alternatively, the base material may be that of which at least the surface consists of a material comprising other reactive group such as a silicon compound having one or more Si—H groups or alkoxysilane.

Next, the film of the above surface-treating composition is formed on the surface of the base material, and the film is post-treated, as necessary, and thereby the surface-treating layer is formed from the surface-treating composition.

The formation of the film of the surface-treating composition can be performed by applying the above surface-treating composition on the surface of the base material such that the surface-treating composition coats the surface. The method of coating is not specifically limited. For example, a wet coating method or a dry coating method can be used.

Examples of the wet coating method include dip coating, spin coating, flow coating, spray coating, roll coating, gravure coating, and a similar method.

Examples of the dry coating method include deposition (usually, vacuum deposition), sputtering, CVD and a similar method. The specific examples of the deposition (usually, vacuum deposition) method include resistance heating, electron beam, high-frequency heating, ion beam, and a similar method. The specific examples of the CVD method include plasma-CVD, optical CVD, thermal CVD and a similar method. The deposition method is will be described below in more detail.

Additionally, coating can be performed by an atmospheric pressure plasma method.

When the wet coating method is used, the surface-treating composition is diluted with a solvent, and then it is applied to the surface of the base material. In view of stability of the surface-treating composition and volatile property of the solvent, the following solvents are preferably used: an aliphatic perfluorohydrocarbon having 5-12 carbon atoms (for example, perfluorohexane, perfluoromethylcyclohexane and perfluoro-1,3-dimethylcyclohexane); an aromatic polyfluorohydrocarbon (for example, bis(trifluoromethyl)benzene); an aliphatic polyfluorohydrocarbon; a hydrofluoroether (HFE) (for example, an alkyl perfluoroalkyl ether such as perfluoropropyl methyl ether ($C_3F_7OCH_3$), perfluorobutyl methyl ether ($C_4F_9OCH_3$), perfluorobutyl ethyl ether ($C_4F_9OC_2H_5$), and perfluorohexyl methyl ether ($C_2F_5CF(OCH_3)C_3F_7$) (the perfluoroalkyl group and the alkyl group may be liner or branched)), and the like. These solvents may be used alone or as a mixture of two or more. Among them, the hydrofluoroether is preferable, perfluorobutyl methyl ether ($C_4F_9OCH_3$) and/or perfluorobutyl ethyl ether ($C_4F_9OC_2H_5$) are particularly preferable.

The formation of the film is preferably performed so that the surface-treating composition is present together with a catalyst for hydrolysis and dehydration-condensation in the coating. Simply, when the wet coating method is used, after the surface-treating composition is diluted with a solvent, and just prior to applying it to the surface of the base material, the catalyst may be added to the diluted solution of the surface-treating composition. When the dry coating method is used, the surface-treating composition to which a catalyst has been added is used itself in deposition (vacuum deposition), or pellets may be used in deposition (vacuum deposition), wherein the pellets is obtained by impregnating a porous metal such as iron or copper with the surface-treating composition to which the catalyst has been added.

As the catalyst, any suitable acid or base can be used. As the acid catalyst, for example, acetic acid, formic acid, trifluoroacetic acid, or the like can be used. As the base catalyst, for example, ammonia, an organic amine, or the like can be used.

The formation of the film of the surface-treating composition is preferably performed by a deposition method although a use method of the surface-treating composition of the present invention is not limited thereto. The deposition method of the present invention comprises applying the surface-treating composition to a material for deposition and forming the deposited film on the surface of the base material. This deposition method is usually a vacuum deposition in vacuum (in other words, under a pressure lower than atmospheric pressure). A pressure during the deposition is, for example, $2 \times 10^{-3}$ Pa to $1 \times 10^{-5}$ Pa, preferably $1 \times 10^{-3}$ Pa to $1 \times 10^{-4}$ Pa. A temperature during the deposition is, for example, 20° C. to 1000° C. The temperature may be stepwise or gradually increased within the range, although it is not limited thereto.

In the deposition method of the present invention, a profile of film thickness deposited per second during the formation of the deposited film has at least two peaks. This is a phenomenon caused by the deference of a vapor pressure between the at least one first compound and at least one second compound which are contained in the surface-treating composition. It can be considered that the vapor pressure of the first compound and the second compound is generally proportional to an average molecular weight of each of the compounds. Therefore, each of the compounds is deposited in order from the compound having lower average molecular weight with having respective distribution. The profile of film thickness is understood to be that obtained by superposing the deposited distributions for each of the compound.

It is preferable that among the at least two peaks, the firstly appearing peak during the formation of the deposited film is derived from the at least one first compound and the lastly appearing peak during the formation of the deposited film is derived from the at least one second compound. This can be achieved by setting the vapor pressure (representatively, average molecular weight) such that the vapor pressure of the at least one second compound is higher than that of the at least one first compound. The average molecular weight of the at least one first compound may be, as described above, 1,000-12,000, preferably 2,000-10,000. In contract, the average molecular weight of the at least one second compound may be selected such that it is 2,000 higher or more, preferably 4,000 higher or more than the average molecular weight of the at least one first compound. However, the firstly appearing peak is not necessarily derived only from the first compound as long as most of it is derived from the at least one first compound. For example, when a material for deposition contains two or more second compound which has a deferent molecular weight from each other, the firstly appearing peak may be derived from the at least one first compound and the at least one second compound which has an average molecular weight equal to or approximate to that of the first compound. The lastly appearing peak is not necessarily derived only from the second compound as long as most of it is derived from the at least one second compound. For example, when a material for deposition contains two or more first compound which has a deferent molecular weight from each other, the lastly appearing peak may be derived from the at least one second compound and the at least one first compound which has an average molecular weight equal to or approximate to that of the second compound.

It is consider that by setting the vapor pressure (average molecular weight) of the at least one second compound higher than the vapor pressure (average molecular weight) of the at least one first compound, firstly, the at least one first compound having the low vapor pressure (low average molecular weight) is preferentially vaporized and deposited on the surface of the base material, and lastly, the at least one second compound having the relatively high vapor pressure (high average molecular weight) is vaporized and deposited on the outermost surface of the base material. The deposited film thus obtained comprises a lower layer contacting the base material and an upper layer (consisting of an exposed surface) positioning at the surface of the layers consisting of the deposited film wherein the lower layer contains a high content ratio of the first compound (or its reactant production) and the upper layer contains a high content ratio of the second compound, in other words the content ratio of the second compound in the upper layer is higher than the content ratio of the second compound in the lower layer. It is noted that a boundary between the lower layer and the upper layer is not necessarily clear as long as there is a significant deference of the content ratio in the deposited film of the second compound between the lower layer and in the upper layer, and one or more intermediate layers may be present between the lower layer and the upper layer.

Next, the film is post-treated as necessary. This post-treatment is, but not limited to, a treatment in which water supplying and dry heating are sequentially performed, in more particular, may be performed as follows. It is noted that the water supplying is not always necessary when all of T are a hydroxyl group in the compound represented by any of the above general formulae (I) and (II).

After the film of the surface-treating composition is formed on the surface of the base material as mentioned above, water is supplied to this film (hereinafter, referred to as precursor coating). The method of supplying water may be, for example, a method using dew condensation due to the temperature difference between the precursor coating (and the base material) and ambient atmosphere or spraying of water vapor (steam), but not specifically limited thereto.

It is considered that, when water is supplied to the precursor coating, water acts on the hydrolyzable group bonded to Si present in the first compound in the surface-treating composition, thereby enabling rapid hydrolysis of the first compound.

The supplying of water may be performed under an atmosphere, for example, at a temperature of zero to 500° C., preferably 100° C. or more and 300° C. or less. By supplying water at such temperature range, hydrolysis can proceed. The pressure at this time is not specifically limited but simply may be ambient pressure.

Then, the precursor coating is heated on the surface of the base material under a dry atmosphere over 60° C. The method of dry heating may be to place the precursor coating together with the base material in an atmosphere at a temperature over 60° C., preferably over 100° C., and for example, of 500° C. or less, preferably of 300° C. or less, and at unsaturated water vapor pressure, but not specifically limited thereto. The pressure at this time is not specifically limited but simply may be ambient pressure.

Under such atmosphere, between the first compounds, the groups bonding to Si after hydrolysis (When all of T are a hydroxyl group in the compound represented by any of the above general formula (I) and (II), the group is the hydroxyl group. Hereinafter the same shall apply.) are rapidly dehydration-condensed with each other. Furthermore, between the first compound and the base material, the group bonding to Si in the first compound after hydrolysis and a reactive group present on the surface of the base material are rapidly reacted, and when the reactive group present on the surface of the base material is a hydroxyl group, dehydration-condensation is caused. The second compound becomes to exist between the first compounds thus formed. As the result, the bond between the first compounds is formed, and the bond between the first compound and the base material is formed as well as the second compound is held or acquired by an affinity to the first compound.

The above supplying of water and dry heating may be sequentially performed by using a superheated water vapor.

The superheated water vapor is a gas which is obtained by heating a saturated water vapor to a temperature over the boiling point, wherein the gas, under an ambient pressure, has become to have a unsaturated water vapor pressure by heating to a temperature over 100° C., generally of 500° C. or less, for example, of 300° C. or less, and over the boiling point. When the base material on which the precursor coating is formed is exposed to a superheated water vapor, firstly, due to the temperature difference between the superheated water vapor and the precursor coating of a relatively low temperature, dew condensation is generated on the surface of the precursor coating, thereby supplying water to the precursor coating. Presently, as the temperature difference between the superheated water vapor and the precursor coating decreases, water on the surface of the precursor coating is evaporated under the dry atmosphere of the superheated water vapor, and an amount of water on the surface of the precursor coating gradually decreases. During the amount of water on the surface of the precursor coating is decreasing, that is, during the precursor coating is under the dry atmosphere, the precursor coating on the surface of the base material contacts with the superheated water vapor, as a result, the precursor coating is heated to the temperature of the superheated water vapor (temperature over 100° C. under ambient pressure). Therefore, by using a superheated water vapor, supplying of water and dry heating are enabled to be sequentially carried out simply by exposing the base material on which the precursor coating is formed to a superheated water vapor.

As mentioned above, the post-treatment can be performed. It is noted that though the post-treatment may be performed in order to further increase friction durability, it is not essential in the producing of the article of the present invention. For example, after applying the surface-treating composition to the surface of the base material, it may be enough to only stand the base material.

As described above, the surface-treating layer derived from the film of the surface-treating composition is formed on the surface of the base material to produce the article of the present invention. The surface-treating layer thus formed has both high surface slip property and high friction durability. Furthermore, this surface-treating layer may have, depending on the surface-treating composition used, water-repellency, oil-repellency, antifouling property (for example, preventing from adhering a fouling such as fingerprints), surface slip property (or lubricity, for example, wiping property of a fouling such as fingerprints and excellent tactile feeling in a finger), in addition to high friction durability, thus may be suitably used as a functional thin film.

In particular, when the formation of the film of the surface-treating composition is performed by the deposition method and the content of the second compound in the deposited film is higher in the upper layer than in the lower layer, the surface-treating layer which is obtained from this deposited film (may or may not be subjected to the above post-treatment) has further high surface slip property because the second compound is present at high content at the exposed surface side of the surface-treating layer. Additionally, the surface-treating layer which is obtained from this deposited film has high friction durability because the first compound is present at relatively high contents at the lower layer side.

The article having the surface-treating layer obtained according to the present invention is not specifically limited to, but may be an optical member. Examples of the optical member include the followings: lens of glasses, or the like; a front surface protective plate, an antireflection plate, a polarizing plate, or an anti-glare plate on a display such as PDP and LCD; a touch panel sheet of an instrument such as a mobile phone or a personal digital assistance; a disk surface of an optical disk such as a Blu-ray disk, a DVD disk, a CD-R or MO; an optical fiber, and the like.

The thickness of the surface-treating layer is not specifically limited. For the optical member, the thickness of the surface-treating layer is within the range of 1-30 nm, preferably 1-15 nm, in view of optical performance, friction durability and antifouling property.

Hereinbefore, the article produced by using the surface-treating composition of the present invention is described in detail. It is noted that an application, a method for using or a method for producing the article are not limited to the above exemplification.

EXAMPLES

The surface-treating composition of the present invention and the article produced by using it will be described in detail through Examples, although the present invention is not limited to Examples.

Preparation of a Surface-Treating Composition

Compound X of the following formula (average molecular weight: about 4,000 ($^{19}$F-NMR value)) was provided as the first compound:

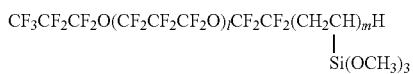

wherein l is an integer of 20-30 or less, and m is an integer of 1-6.

Additionally, Compound Y of the following formula (average molecular weight: about 4,000 ($^{19}$F-NMR value)) was provided as the first compound:

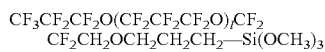

wherein l is an integer of 20-30.

Compounds a-c listed in Table 1 (in the structural formula, l, p and q are any values providing the average molecular weight described in the right column) were provided as the second compound. It is noted that with respect to the average molecular weight, the GPC value is also shown in addition to the $^{19}$F-NMR value in Table 1 for reference.

TABLE 1

| Second compound | Structural formula | Average molecular weight ($^{19}$F-NMR value) | (GPC value) |
|---|---|---|---|
| a | $CF_3CF_2CF_2O(CF_2CF_2CF_2O)_1CF_2CF_3$ | 4000 | 4000 |
| b | $CF_3O(CF_2O)_p(CF_2CF_2O)_qCF_3$ | 25000 | 12500 |
| c | $CF_3O(CF_2O)_p(CF_2CF_2O)_qCF_3$ | 15000 | 8000 |

These compounds were mixed in the ratio shown in "Composition" column in Table 2 to obtain the surface-treating compositions of No. 1-15. It is noted that No. 1-6 and 11-13 are Examples of the present invention and No. 7-10, 14 and 15 are Comparative Examples.

Producing a Sample Article

A chemical strengthening glass (Gorilla glass manufactured by Corning Incorporated; thickness: 0.7 mm) was provided. Firstly, silicon dioxide was deposited on the surface of this chemical strengthening glass in a thickness of 7 nm by using a depositing apparatus (manufactured by Shincron Co., Ltd.) in a manner of an electron-beam deposition to form a silicon dioxide film, and thereby obtaining the base material of which surface consists of silicon dioxide. Next, each of the surface-treating compositions of No. 1-15 prepared above was poured into a cup made of cupper in the amount of 80 mg, and was deposited on the silicon dioxide film by using the above described depositing apparatus in a manner of resistance heating. Thus, the surface-treating layer was formed on the surface of the base material (more specifically, silicon dioxide film) to produce sample articles of No. 1-15.

Evaluation

For the sample articles of No. 1-15 which were produced above, appearance, a use feeling with fingers (surface slip property), a coefficient of dynamic friction (surface slip property) and the number of durable times for friction (friction durability) were evaluated/measured as follows. The results are shown in Table 2.

(Appearance)

Firstly, the presence or absence of a droplet on the treated surface after depositing the surface-treating composition was visually confirmed as a visual estimation.

◯: observing no droplet

X: observing droplet

Additionally, a haze value (%) was measured by using a haze meter as a degree of dulling.

(Use Feeling with Fingers (Surface Slip Property))

Twenty panelists who were specialist on an organoleptic evaluation touched the treated surface with fingers and evaluated the use feeling according to the following criteria, and the average was calculated.

1: very good
2: good
3: normal
4: bad (Coefficient of Dynamic Friction (Surface Slip Property))

Coefficient of dynamic friction (–) was measured by using a surface texture measurement instrument (TriboGear TYPE: 14FW; manufactured by SHINTO Scientific Co. Ltd.) using a steel ball as a friction probe according to ASTM D1894.

Number of Durable Times for Friction (Friction Durability)

Then, as an evaluation of the friction durability, a steel wool friction durability evaluation was performed. Specifically, the base material on which the surface-treating layer was formed was horizontally arranged, and then, a steel wool (grade #0000, dimensions: 10 mm×10 mm×5 mm) was contacted with the exposed surface of the surface-treating layer and a load of 1000 gf was applied thereon. Then, the steel wool was shuttled at a rate of 140 mm/second while applying the load. The static water contact angle was measured per 500 shuttling. The static water contact angle (degree) was measured for 1 µL of water by using a contact angle measuring instrument ("DropMaster" manufactured by KYOWA INTERFACE SCIENCE Co., LTD.). The number of durable times was decided as the friction times at the point that the measured value of the contact angle became to be 100 degree or less.

TABLE 2

| No. | Composition (mass %) | Appearance Visual | Haze value (%) | Use feeling with fingers | Coefficient of dynamic friction (—) | Number of durable times for friction (time) |
|---|---|---|---|---|---|---|
| 1 | X:a:b = 27:7:66 | ○ | 0.18 | 1.2 | 0.055 | 3000 |
| 2 | X:a:b = 40:10:50 | ○ | 0.18 | 1.5 | 0.059 | 4500 |
| 3 | X:a:b = 52:15:33 | ○ | 0.15 | 1.8 | 0.063 | 6000 |
| 4 | X:a:c = 27:7:66 | ○ | 0.13 | 2.1 | 0.066 | 3000 |
| 5 | X:a:c = 40:10:50 | ○ | 0.11 | 2.2 | 0.069 | 4500 |
| 6 | X:a:c = 52:15:33 | ○ | 0.17 | 2.5 | 0.074 | 6000 |
| 7 | X:a:b = 10:5:85 | X | 0.70 | 1.1 | 0.057 | 1000 |
| 8 | X = 100 | ○ | 0.16 | 3.4 | 0.130 | 6000 |
| 9 | a = 100 | ○ | 0.15 | 3.0 | 0.086 | <500 |
| 10 | b = 100 | ○ | 0.14 | 2.5 | 0.071 | <500 |
| 11 | Y:a:b = 24:10:66 | ○ | 0.16 | 2.1 | 0.059 | 3000 |
| 12 | Y:a:b = 47:20:33 | ○ | 0.12 | 2.3 | 0.061 | 4500 |
| 13 | Y:a:c = 24:10:66 | ○ | 0.15 | 2.5 | 0.077 | 5000 |
| 14 | Y:a:c = 10:5:85 | X | 0.80 | 1.1 | 0.057 | 1000 |
| 15 | Y = 100 | ○ | 0.15 | 3.2 | 0.102 | 5000 |

As understood from Table 2, the samples of No. 1-6 and 11-13 which were examples of the present invention provided both high surface slip property and high friction durability. In contrast, for the samples of No. 8 and 15 which were comparative examples, surface slip property was low, and for the samples of No. 7, 9, 10 and 14 which were comparative examples, friction durability was low.

(Profile of a Film Thickness)

For the producing of the sample articles of No. 1-3 and No. 8, a profile of a film thickness deposited per second during the deposition of each of the surface-treating compositions of No. 1-3 and No. 8 was measured. When each of the surface-treating compositions of No. 1-3 was used, two peaks were observed in the profile of film. The first peak firstly appearing after starting the deposition may be considered to be derived from Compound X and Compound a having a low molecular weight (both average molecular weights: about 4,000) among Compounds X, a and b which are contained in the surface-treating composition used. The second peak next (lastly) appearing may be considered to be derived from Compound b having a high molecular weight (average molecular weights: about 25,000). On the other hand, when the surface-treating composition of No. 8 was used, the peak which could be observed in the profile of film was only one. This peak may be considered to be derived from Compound X (average molecular weights: about 4,000) which is contained in the surface-treating composition used.

Therefore, when each of the surface-treating composition of No. 1-3 was used, it may be considered that Compound X and Compound a were preferentially deposited on the surface of the base material, and then Compound b was deposited thereon. It may be considered that the surface-treating layer obtained from the deposited film comprises a lower layer contacting the base material and an upper layer positioning thereabove wherein the content ratio of the second compound (generally, the content ratio of Compound b is about 100% by mass) in the upper layer is higher than the content ratio of the second compound (generally, the mass ratio of Compound a with respect to the total mass of Compound X and Compound a) in the lower layer. On the other hand, when the surface-treating composition of No. 8 was used, it can be considered that a single layer was formed as the surface-treating layer.

Similarly, when each of the surface-treating composition of No. 4-7 was used, it is predicted that two peaks (the first peak derived from Compound X and Compound a and the second peak derived from Compound c) in the profile of film thickness will be observed.

When each of the surface-treating composition of No. 11-14 was used, it is predicted that two peaks (the first peak derived from Compound Y and Compound a and the second peak derived from Compound b or c) in the profile of film thickness will be observed.

When each of the surface-treating composition of No. 9 10 or 15 was used, it is predicted that one peak (a peak derived from Compound a, b or Compound a, respectively) in the profile of film thickness will be observed.

When the surface-treating composition containing Compound X and/or Y and Compound a, b and c was used, it is predicted that three peaks (the first peak derived from Compound Y and/or Y and Compound a, the second peak derived from Compound c and the third peak derived from Compound d) in the profile of film thickness will be observed.

INDUSTRIAL APPLICABILITY

The present invention is suitably applied for forming a surface-treating layer on a surface of various base materials, in particular, an optical member in which transparency is required.

The invention claimed is:

1. A surface-treating composition comprising a fluorine-containing polymer wherein the surface-treating composition comprises:
at least one first compound represented by any of the following general formulae (I) and (II):

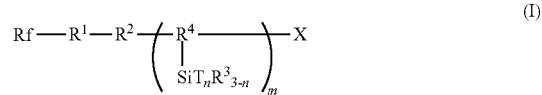

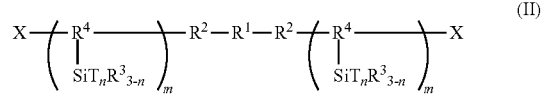

wherein:
Rf is an alkyl group having 1 to 16 carbon atoms which may be substituted by one or more fluorine atoms;
$R^1$ is a group represented by the following formula:

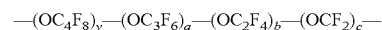

wherein:
a, b, c and v are each independently an integer of 0-200, wherein the sum of a, b, c and v is at least one, and the occurrence order of the respective repeating units in parentheses is not limited in the formula;

$R^2$ is a group represented by the following formula:

$-(Q)_d-(CFZ)_e-(CH_2)_f-$ wherein:
Q is an oxygen atom or a divalent polar group;
Z is a fluorine atom or a lower fluoroalkyl group; and
d, e and f are each independently an integer of 0-50, wherein the sum of d, e and f is at least one, and the occurrence order of the respective repeating units in parentheses is not limited in the formula;
T is a hydroxyl group or a hydrolyzable group;
$R^3$ is a hydrogen atom or an alkyl group having 1 to 22 carbon atoms;
n is an integer from 1 to 3;
$R^4$ is a group represented by the following formula:

$$-CH_2-\underset{\underset{|}{(CH_2)_g}}{\overset{\overset{Y}{|}}{C}}-$$

wherein:
Y is a hydrogen atom or a lower alkyl group, and
g is an integer of 0-50;
X is a hydrogen atom, an alkyl group having 1 to 4 carbon atoms or a halogen atom; and
m is an integer of 1-10; and at least one second compound represented by the following general formula (III):

$$Rf-R^1-Rf' \qquad (III)$$

wherein:
Rf is an alkyl group having 1 to 16 carbon atoms which may be substituted by one or more fluorine atoms;
Rf' is an alkyl group having 1 to 16 carbon atoms which may be substituted by one or more fluorine atoms, a fluorine atom or a hydrogen atom;
$R^1$ is a group represented by the following formula:

$-(OC_4F_8)_w-(OC_3F_6)_r-(OC_2F_4)_s-(OCF_2)_t-$ wherein:
r, s, t and w are each independently an integer of 0-300, wherein the sum of r, s, t and w is at least one, and the occurrence order of the respective repeating units in parentheses is not limited in the formula; and
the proportion of the first compound is 15 to 70% by mass with respect to the total mass of the first compound and the second compound; and
the average molecular weight of the at least one second compound is 2,000 higher or more than the average molecular weight of the at least one first compound.

2. The surface-treating composition according to claim 1 wherein the first compound is one or more compounds represented by any of the following general formulae (Ia) and (IIa):

$$Rf-(OC_4F_8)_v-(OC_3F_6)_a-(OC_2F_4)_b-(OCF_2)_c-\underset{\underset{|}{Z}}{OCF(CF_2)_h}-\underset{\underset{|}{(CH_2)_i-SiT_nR^3_{3-n}}}{\overset{\overset{Y}{|}}{(CH_2C)_m}}-X' \qquad (Ia)$$

$$\underset{\underset{|}{R^3_{3-n}T_nSi-(CH_2)_i}}{X'-(CCH_2)_m}\overset{\overset{Y}{|}}{-}\underset{\underset{|}{Z}}{(CF_2)_hCF}-(OC_4F_8)_v-(OC_3F_6)_a-(OC_2F_4)_b-(OCF_2)_c-\underset{\underset{|}{Z}}{OCF(CF_2)_h}-\underset{\underset{|}{(CH_2)_i-SiT_nR^3_{3-n}}}{\overset{\overset{Y}{|}}{(CH_2C)_m}}-X' \qquad (IIa)$$

wherein:
Rf, a, b, c, v, T, $R^3$, n, m, Y and Z are as defined above;
h is 0 or 1;
i is an integer of 0-2; and
X' is a hydrogen atom or a halogen atom;
wherein the occurrence order of the respective repeating units in parentheses with the subscript a, b, c or v is not limited in the formulae.

3. The surface-treating composition according to claim 1 wherein the first compound is one or more compounds represented by any of the following general formulae (Ib) and (IIb):

$$Rf-(OC_4F_8)_v-(OC_3F_6)_a-(OC_2F_4)_b-(OCF_2)_c-\underset{\underset{|}{Z}}{OCF(CF_2)_h}-(CH_2)_j-O-(CH_2)_k-SiT_nR^3_{3-n} \qquad (Ib)$$

$$R^3_{3-n}T_nSi-(CH_2)_k-O-(CH_2)_j-(CF_2)_h\underset{\underset{|}{Z}}{CF}-*$$

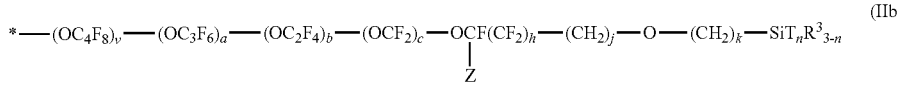

wherein:
Rf, a, b, c, v, T, $R^3$, n and Z are as defined above;
h is 0 or 1;
j is 1 or 2;
k is an integer of 2-20;
wherein the occurrence order of the respective repeating units in parentheses with the subscript a, b, c or v is not limited in the formulae.

4. The surface-treating composition according to claim 1 wherein $R^1$ is a group of the formula: —$(OCF_2CF_2CF_2)_{a'}$—; and a' is an integer of 1-100 in the general formulae (I) and (II) for the first compound.

5. The surface-treating composition according to claim 1 wherein Rf is an perfluoroalkyl group having 1-16 carbon atoms in the first compound.

6. The surface-treating composition according to claim 1 wherein the second compound has an average molecular weight of 1,000-30,000.

7. The surface-treating composition according to claim 1 wherein the second compound is one or more compounds represented by any of the general formulae (IIIa) and (IIIb):

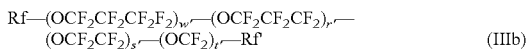

wherein:
Rf and Rf' are as defined above;
in formula (IIIa), r' is an integer of 1-100; and
in formula (IIIb), w' and r' are each independently an integer of 1-30; and s' and t' are each independently an integer of 1-300;
wherein the occurrence order of the respective repeating units in parentheses with the subscript w', r', s' or t' is not limited in the formulae.

8. The surface-treating composition according to claim 7 wherein the second compound comprises the compound represented by the general formula (IIIa) and the compound represented by the general formula (IIIb) in ratio of 1:1-1:30.

9. The surface-treating composition according to claim 7 wherein the compound represented by the general formula (IIIa) has an average molecular weight of 2,000-6,000.

10. The surface-treating composition according to claim 7 wherein the compound represented by the general formula (IIIb) has an average molecular weight of 8,000-30,000.

11. An article comprising a base material and a layer which is formed from the surface-treating composition according to claim 1.

12. A method of vapor deposition comprising:
forming a deposited film on a surface of a base material by using the surface-treating composition according to claim 1 as a depositing material,
wherein a profile of film thickness deposited per second during the formation of the deposited film has at least two peaks.

13. The method of vapor deposition according to claim 12 wherein among the at least two peaks, the firstly appearing peak during the formation of the deposited film is derived from the at least one first compound and the lastly appearing peak during the formation of the deposited film is derived from the at least one second compound.

14. An article comprising a base material and a layer consisting of the deposited film formed on a surface of the base material by the method of vapor deposition according to claim 12.

15. The article according to claim 14 wherein the layer consisting of the deposited film comprises a lower layer contacting to the base material and an upper layer located at a surface of the layer consisting of the deposited film, and a content ratio of the second compound in the upper layer is higher than a content ratio of the second compound in the lower layer.

\* \* \* \* \*